(12) United States Patent
Sato

(10) Patent No.: US 12,224,027 B2
(45) Date of Patent: Feb. 11, 2025

(54) MEMORY SYSTEM AND INFORMATION PROCESSING SYSTEM FOR TESTING STORAGE AREAS OF NONVOLATILE MEMORY

(71) Applicant: Kioxia Corporation, Tokyo (JP)

(72) Inventor: Masayoshi Sato, Yokohama (JP)

(73) Assignee: Kioxia Corporation, Tokyo (JP)

( * ) Notice: Subject to any disclaimer, the term of this patent is extended or adjusted under 35 U.S.C. 154(b) by 195 days.

(21) Appl. No.: 17/939,180

(22) Filed: Sep. 7, 2022

(65) Prior Publication Data

US 2023/0298684 A1  Sep. 21, 2023

(30) Foreign Application Priority Data

Mar. 16, 2022  (JP) ................................ 2022-041506

(51) Int. Cl.
*G11C 29/46*  (2006.01)
*G11C 29/12*  (2006.01)
*G11C 29/18*  (2006.01)

(52) U.S. Cl.
CPC .......... *G11C 29/46* (2013.01); *G11C 29/1201* (2013.01); *G11C 29/18* (2013.01)

(58) Field of Classification Search
None
See application file for complete search history.

(56) References Cited

U.S. PATENT DOCUMENTS

| | | | | |
|---|---|---|---|---|
| 5,835,430 A | * | 11/1998 | Henning | ................ G11C 29/76 365/201 |
| 5,875,195 A | * | 2/1999 | Dixon | ................... G06F 11/261 714/719 |
| 6,467,054 B1 | * | 10/2002 | Lenny | ...................... H04L 9/40 369/53.17 |
| 9,838,254 B2 | | 12/2017 | Taniuchi | |
| 10,803,970 B2 | | 10/2020 | Schuh et al. | |
| 2011/0219276 A1 | * | 9/2011 | Tanefusa | ................ G11C 29/56 714/E11.177 |
| 2013/0124932 A1 | | 5/2013 | Schuh et al. | |
| 2015/0280982 A1 | | 10/2015 | Taniuchi | |
| 2015/0287478 A1 | * | 10/2015 | Chen | ...................... G11C 29/44 714/719 |

FOREIGN PATENT DOCUMENTS

JP  2013-196333 A  9/2013

* cited by examiner

*Primary Examiner* — J. H. Hur
(74) *Attorney, Agent, or Firm* — Oblon, McClelland, Maier & Neustadt, L.L.P.

(57) ABSTRACT

According to one embodiment, a controller configured to manage second test information including status information indicating that a test related to a write operation and a read operation on a second storage area has not been executed. In response to receiving a command for acquiring information related to the second storage area from a host, the controller transmits the second test information to the host. When execution of the test on the second storage area is requested by the host, the controller executes the test related to the write operation and the read operation on the second storage area, and updates the status information of the second test information.

20 Claims, 12 Drawing Sheets

| channel | bank | chip | plane | test | ~73 | channel | bank | chip | plane | test | ~73 |
|---|---|---|---|---|---|---|---|---|---|---|---|
| Ch0 | B0 | #0 | #0 | tested | r1 | Ch2 | B0 | #0 | #0 | tested | r33 |
| Ch0 | B0 | #0 | #1 | tested | r2 | Ch2 | B0 | #0 | #1 | tested | r34 |
| Ch0 | B0 | #1 | #0 | tested | r3 | Ch2 | B0 | #1 | #0 | tested | r35 |
| Ch0 | B0 | #1 | #1 | tested | r4 | Ch2 | B0 | #1 | #1 | tested | r36 |
| Ch0 | B1 | #0 | #0 | untested | r5 | Ch2 | B1 | #0 | #0 | untested | r37 |
| Ch0 | B1 | #0 | #1 | untested | r6 | Ch2 | B1 | #0 | #1 | untested | r38 |
| Ch0 | B1 | #1 | #0 | untested | r7 | Ch2 | B1 | #1 | #0 | untested | r39 |
| Ch0 | B1 | #1 | #1 | untested | r8 | Ch2 | B1 | #1 | #1 | untested | r40 |
| Ch0 | B2 | #0 | #0 | untested | r9 | Ch2 | B2 | #0 | #0 | untested | r41 |
| Ch0 | B2 | #0 | #1 | untested | r10 | Ch2 | B2 | #0 | #1 | untested | r42 |
| Ch0 | B2 | #1 | #0 | untested | r11 | Ch2 | B2 | #1 | #0 | untested | r43 |
| Ch0 | B2 | #1 | #1 | untested | r12 | Ch2 | B2 | #1 | #1 | untested | r44 |
| Ch0 | B3 | #0 | #0 | untested | r13 | Ch2 | B3 | #0 | #0 | untested | r45 |
| Ch0 | B3 | #0 | #1 | untested | r14 | Ch2 | B3 | #0 | #1 | untested | r46 |
| Ch0 | B3 | #1 | #0 | untested | r15 | Ch2 | B3 | #1 | #0 | untested | r47 |
| Ch0 | B3 | #1 | #1 | untested | r16 | Ch2 | B3 | #1 | #1 | untested | r48 |
| Ch1 | B0 | #0 | #0 | tested | r17 | Ch3 | B0 | #0 | #0 | tested | r49 |
| Ch1 | B0 | #0 | #1 | tested | r18 | Ch3 | B0 | #0 | #1 | tested | r50 |
| Ch1 | B0 | #1 | #0 | tested | r19 | Ch3 | B0 | #1 | #0 | tested | r51 |
| Ch1 | B0 | #1 | #1 | tested | r20 | Ch3 | B0 | #1 | #1 | tested | r52 |
| Ch1 | B1 | #0 | #0 | untested | r21 | Ch3 | B1 | #0 | #0 | untested | r53 |
| Ch1 | B1 | #0 | #1 | untested | r22 | Ch3 | B1 | #0 | #1 | untested | r54 |
| Ch1 | B1 | #1 | #0 | untested | r23 | Ch3 | B1 | #1 | #0 | untested | r55 |
| Ch1 | B1 | #1 | #1 | untested | r24 | Ch3 | B1 | #1 | #1 | untested | r56 |
| Ch1 | B2 | #0 | #0 | untested | r25 | Ch3 | B2 | #0 | #0 | untested | r57 |
| Ch1 | B2 | #0 | #1 | untested | r26 | Ch3 | B2 | #0 | #1 | untested | r58 |
| Ch1 | B2 | #1 | #0 | untested | r27 | Ch3 | B2 | #1 | #0 | untested | r59 |
| Ch1 | B2 | #1 | #1 | untested | r28 | Ch3 | B2 | #1 | #1 | untested | r60 |
| Ch1 | B3 | #0 | #0 | untested | r29 | Ch3 | B3 | #0 | #0 | untested | r61 |
| Ch1 | B3 | #0 | #1 | untested | r30 | Ch3 | B3 | #0 | #1 | untested | r62 |
| Ch1 | B3 | #1 | #0 | untested | r31 | Ch3 | B3 | #1 | #0 | untested | r63 |
| Ch1 | B3 | #1 | #1 | untested | r32 | Ch3 | B3 | #1 | #1 | untested | r64 |

| channel | bank | chip | plane | test | |
|---|---|---|---|---|---|
| Ch0 | B0 | #0 | #0 | tested | r1 |
| Ch0 | B0 | #0 | #1 | tested | r2 |
| Ch0 | B0 | #1 | #0 | tested | r3 |
| Ch0 | B0 | #1 | #1 | tested | r4 |
| Ch0 | B1 | #0 | #0 | untested | r5 |
| Ch0 | B1 | #0 | #1 | untested | r6 |
| Ch0 | B1 | #1 | #0 | untested | r7 |
| Ch0 | B1 | #1 | #1 | untested | r8 |
| Ch0 | B2 | #0 | #0 | untested | r9 |
| Ch0 | B2 | #0 | #1 | untested | r10 |
| Ch0 | B2 | #1 | #0 | untested | r11 |
| Ch0 | B2 | #1 | #1 | untested | r12 |
| Ch0 | B3 | #0 | #0 | untested | r13 |
| Ch0 | B3 | #0 | #1 | untested | r14 |
| Ch0 | B3 | #1 | #0 | untested | r15 |
| Ch0 | B3 | #1 | #1 | untested | r16 |
| Ch1 | B0 | #0 | #0 | tested | r17 |
| Ch1 | B0 | #0 | #1 | tested | r18 |
| Ch1 | B0 | #1 | #0 | tested | r19 |
| Ch1 | B0 | #1 | #1 | tested | r20 |
| Ch1 | B1 | #0 | #0 | untested | r21 |
| Ch1 | B1 | #0 | #1 | untested | r22 |
| Ch1 | B1 | #1 | #0 | untested | r23 |
| Ch1 | B1 | #1 | #1 | untested | r24 |
| Ch1 | B2 | #0 | #0 | untested | r25 |
| Ch1 | B2 | #0 | #1 | untested | r26 |
| Ch1 | B2 | #1 | #0 | untested | r27 |
| Ch1 | B2 | #1 | #1 | untested | r28 |
| Ch1 | B3 | #0 | #0 | untested | r29 |
| Ch1 | B3 | #0 | #1 | untested | r30 |
| Ch1 | B3 | #1 | #0 | untested | r31 |
| Ch1 | B3 | #1 | #1 | untested | r32 |

FIG. 9A

| channel | bank | chip | plane | test | |
|---|---|---|---|---|---|
| Ch2 | B0 | #0 | #0 | tested | r33 |
| Ch2 | B0 | #0 | #1 | tested | r34 |
| Ch2 | B0 | #1 | #0 | tested | r35 |
| Ch2 | B0 | #1 | #1 | tested | r36 |
| Ch2 | B1 | #0 | #0 | untested | r37 |
| Ch2 | B1 | #0 | #1 | untested | r38 |
| Ch2 | B1 | #1 | #0 | untested | r39 |
| Ch2 | B1 | #1 | #1 | untested | r40 |
| Ch2 | B2 | #0 | #0 | untested | r41 |
| Ch2 | B2 | #0 | #1 | untested | r42 |
| Ch2 | B2 | #1 | #0 | untested | r43 |
| Ch2 | B2 | #1 | #1 | untested | r44 |
| Ch2 | B3 | #0 | #0 | untested | r45 |
| Ch2 | B3 | #0 | #1 | untested | r46 |
| Ch2 | B3 | #1 | #0 | untested | r47 |
| Ch2 | B3 | #1 | #1 | untested | r48 |
| Ch3 | B0 | #0 | #0 | tested | r49 |
| Ch3 | B0 | #0 | #1 | tested | r50 |
| Ch3 | B0 | #1 | #0 | tested | r51 |
| Ch3 | B0 | #1 | #1 | tested | r52 |
| Ch3 | B1 | #0 | #0 | untested | r53 |
| Ch3 | B1 | #0 | #1 | untested | r54 |
| Ch3 | B1 | #1 | #0 | untested | r55 |
| Ch3 | B1 | #1 | #1 | untested | r56 |
| Ch3 | B2 | #0 | #0 | untested | r57 |
| Ch3 | B2 | #0 | #1 | untested | r58 |
| Ch3 | B2 | #1 | #0 | untested | r59 |
| Ch3 | B2 | #1 | #1 | untested | r60 |
| Ch3 | B3 | #0 | #0 | untested | r61 |
| Ch3 | B3 | #0 | #1 | untested | r62 |
| Ch3 | B3 | #1 | #0 | untested | r63 |
| Ch3 | B3 | #1 | #1 | untested | r64 |

F I G. 9B identify namespace data structure  67

| bytes | size (byte) | descriptions |
|---|---|---|
| 07:00 | 8 | size of namespace |
| ⋮ | | ⋮ |
| 4000 | 1 | FAT completion status (FFh: not executed, 00h: in progress, 01h: completed) |

F I G. 10 identify namespace data structure  67

| bytes | size (byte) | descriptions |
|---|---|---|
| 07:00 | 8 | size of namespace |
| ⋮ | | ⋮ |
| 4000 | 1 | FAT completion status (FFh: not executed, 00h: in progress, 01h: completed) |
| 4001 | 1 | format for namespace (FFh: not executed, 00h: in progress, 01h: completed) |
| 4002 | 1 | sequential write for namespace (FFh: not executed, 00h: in progress, 01h: completed) |
| 4003 | 1 | sequential read for namespace (FFh: not executed, 00h: in progress, 01h: completed) |

F I G. 11

| identify namespace data structure | 0 | 1 | 2 | 3 | 4 | 5 | 6 | 7 |
|---|---|---|---|---|---|---|---|---|
| 0~7 | size of namespace ||||||||
| 8~399 | ... ||||||||
| 400~407 | action code (0002h) | size (40) | reserved | opcode | sequential/ random | FAT completion status ||
| 408~415 | start LBA (SLBA:63-0 bit) ||||||||
| 416~423 | end LBA (ELBA:63-0 bit) ||||||||
| 424~431 | number of logical blocks (NLB) | | | | execution time (EXTIM:sec) ||||
| 432~439 | interval (msec) | | | | reserved ||||

67

F I G. 12

| identify namespace data structure | 0 | 1 | 2 | 3 | 4 | 5 | 6 | 7 |
|---|---|---|---|---|---|---|---|---|
| 0~7 | size of namespace ||||||||
| 8~399 | ... ||||||||
| 400~407 | action code (8000h) || size (16) | reserved | reserved | reserved | reserved |
| | WTS || WTMS |||||
| 408~415 | | | | | | | FAT completion status |
| | WTMS ||||||||

F I G. 13 identify namespace data structure

| | 0 | 1 | 2 | 3 | 4 | 5 | 6 | 7 | |
|---|---|---|---|---|---|---|---|---|---|
| 00h | 7Dh | FAh | EAh | 29h | 00h | 00h | 00h | 00h | } size of namespace |
| ... | | | | | | | | | |
| 190h | 02h | 00h | 28h | 00h | 01h | 00h | FFh | 00h | } write test (first entry) |
| 198h | 2Ah | FEh | F8h | 0Dh | 00h | 00h | 00h | 00h | |
| 1A0h | A7h | F8h | E3h | 37h | 00h | 00h | 00h | 00h | |
| 1A8h | 00h | 01h | 00h | 00h | 00h | 00h | 00h | 00h | |
| 1B0h | 00h | 00h | 00h | 00h | 00h | 00h | 00h | 00h | } wait (second entry) |
| 1B8h | 00h | 80h | 10h | 00h | 00h | 00h | FFh | 00h | |
| 1C0h | 08h | 07h | 00h | 00h | 02h | 00h | FFh | 00h | |
| 1C8h | 02h | 00h | 28h | 0Dh | 00h | 00h | 00h | 00h | } read test (third entry) |
| 1D0h | 2Ah | FEh | F8h | 37h | 00h | 00h | FFh | 00h | |
| 1D8h | A7h | F8h | E3h | 00h | 00h | 00h | 00h | 00h | |
| 1E0h | 00h | 01h | 00h | 00h | 00h | 00h | 00h | 00h | |
| 1E8h | 00h | 00h | 00h | 00h | 00h | 00h | 00h | 00h | |

67

F I G. 14

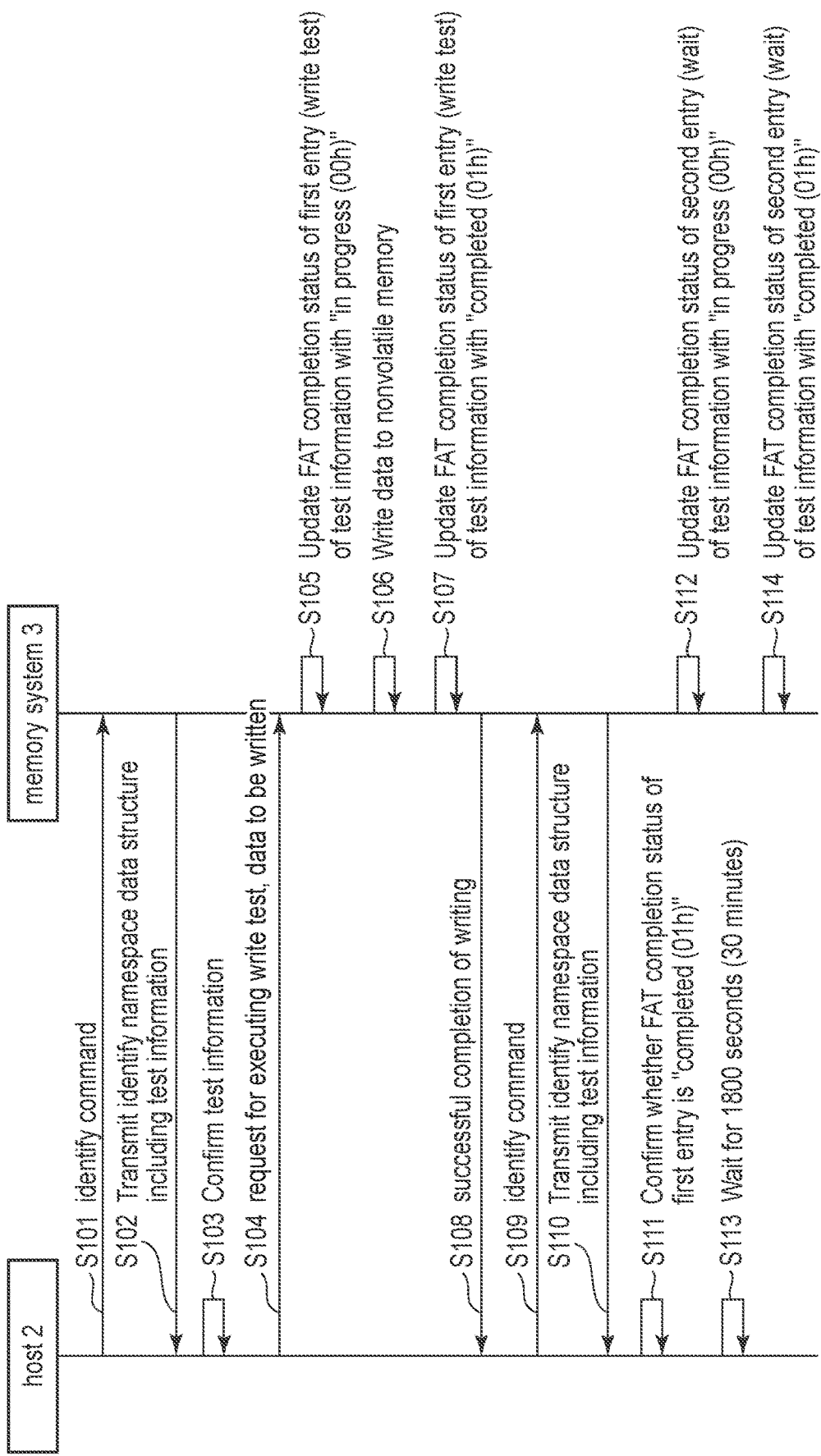
F I G. 15

MEMORY SYSTEM AND INFORMATION PROCESSING SYSTEM FOR TESTING STORAGE AREAS OF NONVOLATILE MEMORY

CROSS-REFERENCE TO RELATED APPLICATIONS

This application is based upon and claims the benefit of priority from Japanese Patent Application No. 2022-041506, filed Mar. 16, 2022, the entire contents of which are incorporated herein by reference.

FIELD

Embodiments described herein relate generally to a memory system and an information processing system.

BACKGROUND

In recent years, memory systems that control nonvolatile memory are widely used. As one of such memory systems, a solid state drive (SSD) that includes a NAND flash memory is known. In a final assembling and testing (FAT) process for the memory system such as the SSD, a test related to a write operation and a read operation is executed.

As the capacity of the memory system is increased, the time for executing the test in the FAT process of the memory system is lengthened. Thus, there is a need for technology which can shorten the time for executing the test for the memory system.

BRIEF DESCRIPTION OF THE DRAWINGS

FIG. 9A illustrates a first part of an example of a test execution status management table according to the embodiment of the present invention.

FIG. 9B illustrates a second part of the example of the test execution status management table according to the embodiment of the present invention.

FIG. 10 illustrates an example of an identify namespace data structure which stores the same information as test information according to the embodiment of the present invention.

FIG. 11 illustrates another example of an identify namespace data structure which stores the same information as test information according to the embodiment of the present invention.

FIG. 12 illustrates an example of an identify namespace data structure which stores the same information as test information indicating a write operation or a read operation according to the embodiment of the present invention.

FIG. 13 illustrates an example of an identify namespace data structure which stores the same information as test information indicating a wait operation according to the embodiment of the present invention.

FIG. 14 illustrates an example of an identify namespace data structure which stores the same information as test information indicating a write operation, a wait operation and a read operation according to the embodiment of the present invention.

FIG. 15 is a sequence diagram illustrating a part of an example of the procedure of a test process executed in the host and the memory system according to the embodiment of the present invention.

DETAILED DESCRIPTION

Various embodiments will be described hereinafter with reference to the accompanying drawings.

In general, according to one embodiment, a memory system comprises a nonvolatile memory that includes storage areas, and a controller configured to control the nonvolatile memory. The storage areas include at least a first storage area on which a test related to a write operation and a read operation has been executed, and a second storage area on which the test has not been executed. The controller manages first test information and second test information, the first test information including status information indicating that a test related to a write operation and a read operation on the first storage area has been executed, the second test information including status information indicating that a test related to a write operation and a read operation on the second storage area has not been executed. In response to receiving, from the host, a command to acquire information related to the second storage area, the controller transmits the second test information that corresponds to the second storage area to the host. When execution of the test related to the write operation and the read operation on the second storage area is requested by the host, the controller executes the test related to the write operation and the read operation on the second storage area. When the test related to the write operation and the read operation on the second storage area has been completed, the controller updates the status information of the second test information with a first value indicating that the test on the second storage area has been executed.

Figure 1:
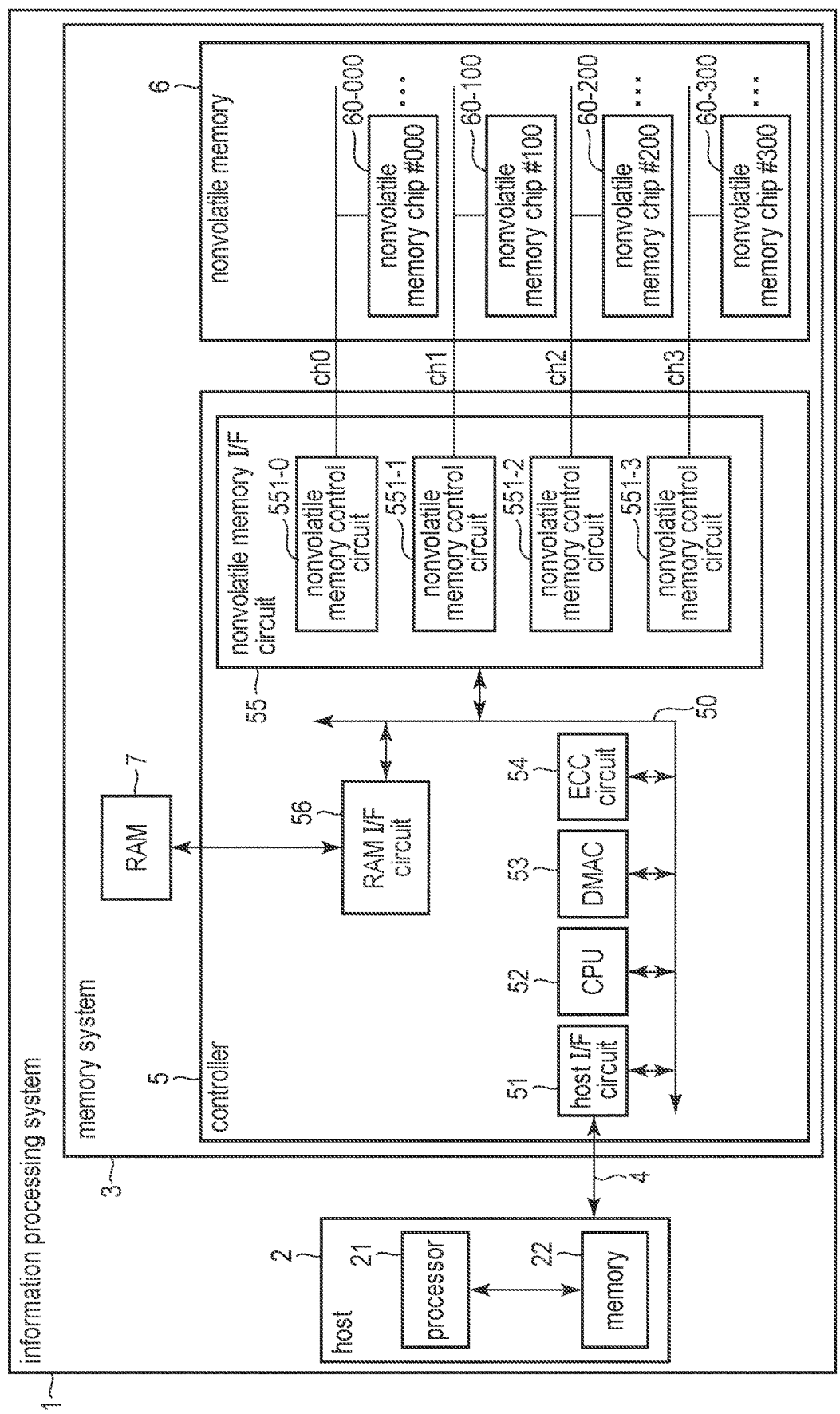
FIG. 1 is a block diagram illustrating an example of a configuration of an information processing system that includes a memory system according to an embodiment of the present invention.

A configuration of a memory system according to an embodiment of the present invention will be described. FIG. 1 is a block diagram illustrating an example of a configuration of an information processing system that includes a memory system according to an embodiment of the present invention. The information processing system 1 includes a host 2 and a memory system 3.

The host 2 is an information processing device. The host 2 is, for example, a personal computer or a server computer. The host 2 accesses the memory system 3. Specifically, the host 2 transmits a write command that is a command to write data, to the memory system 3. The host 2 transmits a read command that is a command to read data, to the memory system 3.

The memory system 3 is a storage device. The memory system 3 is, for example, an SSD including a NAND flash memory. The memory system 3 is connectable to the host 2 through a bus 4.

The host 2 and the memory system 3 are connectable through the bus 4. The bus 4 is, for example, a PCI Express™ bus (PCIe™ bus). The bus 4 is mainly used for transmission of a command (I/O command or management command) from the host 2 to the memory system 3 and transmission of a response from the memory system 3 to the host 2. The I/O command is a command for writing or reading data to or from a nonvolatile memory. The I/O command, for example, is a write command or a read command. The management command is a command for managing the memory system 3. The management command is, for example, an identify command defined in the NVMe standard. The identify command is a command for acquiring information related to a controller 5 included in the memory system 3 or information related to a namespace.

The communication between the host 2 and the memory system 3 through the bus 4 is executed on the basis of, for example, the NVM Express™ (NVMe™) standard. In the communication between the host 2 and the memory system 3 through the bus 4, one namespace may correspond to one storage area of the memory system 3. Each of a plurality of namespaces is a set of contiguous logical addresses. The logical address is an address used by the host 2 to logically specify an address in a memory space of the memory system 3. As the logical address, a logical block address (LBA) may be used. Each of the namespaces is used by the host 2 to access the memory system 3.

Hereinafter, an internal configuration of the host 2 will be described. The host 2 includes a processor 21 and a memory 22.

The processor 21 is a central processing unit (CPU). The processor 21 communicates with the memory system 3 through the bus 4. The processor 21 executes a software (host software) that is loaded onto the memory 22. For example, the host software is loaded from the memory system 3 onto the memory 22. The host software includes an operating system, a file system, a device driver, and an application program.

The memory 22 is a volatile memory. The memory 22 is, for example, a random access memory such as a dynamic random access memory (DRAM).

An internal configuration of the memory system 3 will then be described. The memory system 3 includes the controller 5, a nonvolatile memory 6 and a random access memory (RAM) 7.

The controller 5 is a memory controller. The controller 5 is, for example, a control circuit such as a system-on-a-chip (SoC). The controller 5 is communicatively connected to the nonvolatile memory 6. The controller 5 performs writing of data into the nonvolatile memory 6. The controller 5 performs reading of data from the nonvolatile memory 6. The controller 5 is communicatively connected to the RAM 7. The controller 5 performs writing of data to the RAM 7. The controller 5 performs reading of data from the RAM 7. The controller 5 performs communication with the outside through the bus 4.

The nonvolatile memory 6 is a nonvolatile memory. The nonvolatile memory 6 is, for example, a NAND flash memory. The nonvolatile memory 6 is, for example, a flash memory of a two-dimensional structure or a flash memory of a three-dimensional structure. The nonvolatile memory 6 includes multiple planes. Each of the planes includes multiple blocks. Each of the blocks is a unit of a data erase operation. The data erase operation is an operation of erasing data. Each of the blocks is also referred to as a physical block, an erase block, a flash block, or a memory block. Each of the blocks includes multiple pages. Each of the pages is a unit of a data write operation and a data read operation. The data write operation is an operation of writing data. The data read operation is an operation of reading data. Each of the pages includes a plurality of memory cells that are connected to a single word line.

The RAM 7 is a volatile memory. The RAM 7 is, for example, a dynamic RAM (DRAM). For example, the RAM 7 temporarily stores received write data or read data read from the nonvolatile memory 6. That is, the RAM 7 is used as a write buffer or a read buffer.

An internal configuration of the controller 5 will then be described. The controller 5 includes a host interface circuit 51, a CPU 52, a direct memory access controller (DMAC) 53, an error correction code (ECC) circuit 54, a nonvolatile memory interface circuit 55, and a RAM interface circuit 56. The host interface circuit 51, the CPU 52, the DMAC 53, the ECC circuit 54, the nonvolatile memory interface circuit 55, and the RAM interface circuit 56 are connected to an internal bus 50.

The host interface circuit 51 is a hardware interface. The host interface circuit 51 performs communication with the outside. The host interface circuit 51 receives various commands. The various commands include, for example, I/O commands and management commands.

The CPU 52 is a processor. The CPU 52 controls the host interface circuit 51, the DMAC 53, the ECC circuit 54, the nonvolatile memory interface circuit 55, and the RAM interface circuit 56. The CPU 52 loads a control program (firmware) from a ROM (not shown) or the nonvolatile memory 6 onto the RAM 7. The CPU 52 executes the control program (firmware). The CPU 52 executes various processes on the basis of instructions included in the firmware. The CPU 52 performs, for example, as a flash translation layer (FTL), management of data stored in the nonvolatile memory 6 and management of blocks included in the nonvolatile memory 6. The management of data stored in the nonvolatile memory 6 is, for example, management of mapping information. The mapping information is information indicative of a corresponding relationship between logical addresses and physical addresses. Each of the physical addresses is an address that indicates a physical storage location included in the nonvolatile memory 6. The management of blocks included in the nonvolatile memory 6 is, for example, management of defective blocks (bad blocks) included in the nonvolatile memory 6, wear leveling, and garbage collection.

The DMAC 53 is a circuit which executes direct memory access (DMA). The DMAC 53 executes data transfer between the RAM 7 and the memory 22 of the host 2.

The ECC circuit 54 is a circuit which performs encoding of data and decoding of data. The ECC circuit 54 adds an error correction code (ECC), as a redundant code, to data to be written into the nonvolatile memory 6 (ECC encoding).

When data is read from the nonvolatile memory 6, the ECC circuit 54 performs error correction of the read data by using an ECC added to the read data (ECC decoding).

The nonvolatile memory interface circuit 55 is a circuit which controls the nonvolatile memory 6. The nonvolatile memory interface circuit 55 includes, for example, nonvolatile memory control circuits 551-0, 551-1, 551-2, and 551-3. The nonvolatile memory control circuits 551-0, 551-1, 551-2, and 551-3 are connected to channels ch0, ch1, ch2, and ch3, respectively. When the nonvolatile memory 6 includes a plurality of nonvolatile memory chips, each of the nonvolatile memory control circuits 551-0, 551-1, 551-2 and 551-3 is connected to one or more nonvolatile memory chips (flash dies) through a corresponding channel. For example, the nonvolatile memory control circuit 551-0 is connected to nonvolatile memory chips 60-000, . . . , through the channel ch0. The nonvolatile memory control circuit 551-1 is connected to nonvolatile memory chips 60-100, . . . , through the channel ch1. The nonvolatile memory control circuit 551-2 is connected to nonvolatile memory chips 60-200, . . . , through the channel ch2. The nonvolatile memory control circuit 551-3 is connected to nonvolatile memory chips 60-300, . . . , through the channel ch3.

The RAM interface circuit 56 is a circuit which controls the RAM 7. The RAM interface circuit 56 is, for example, a circuit which controls a DRAM.

Figure 2:
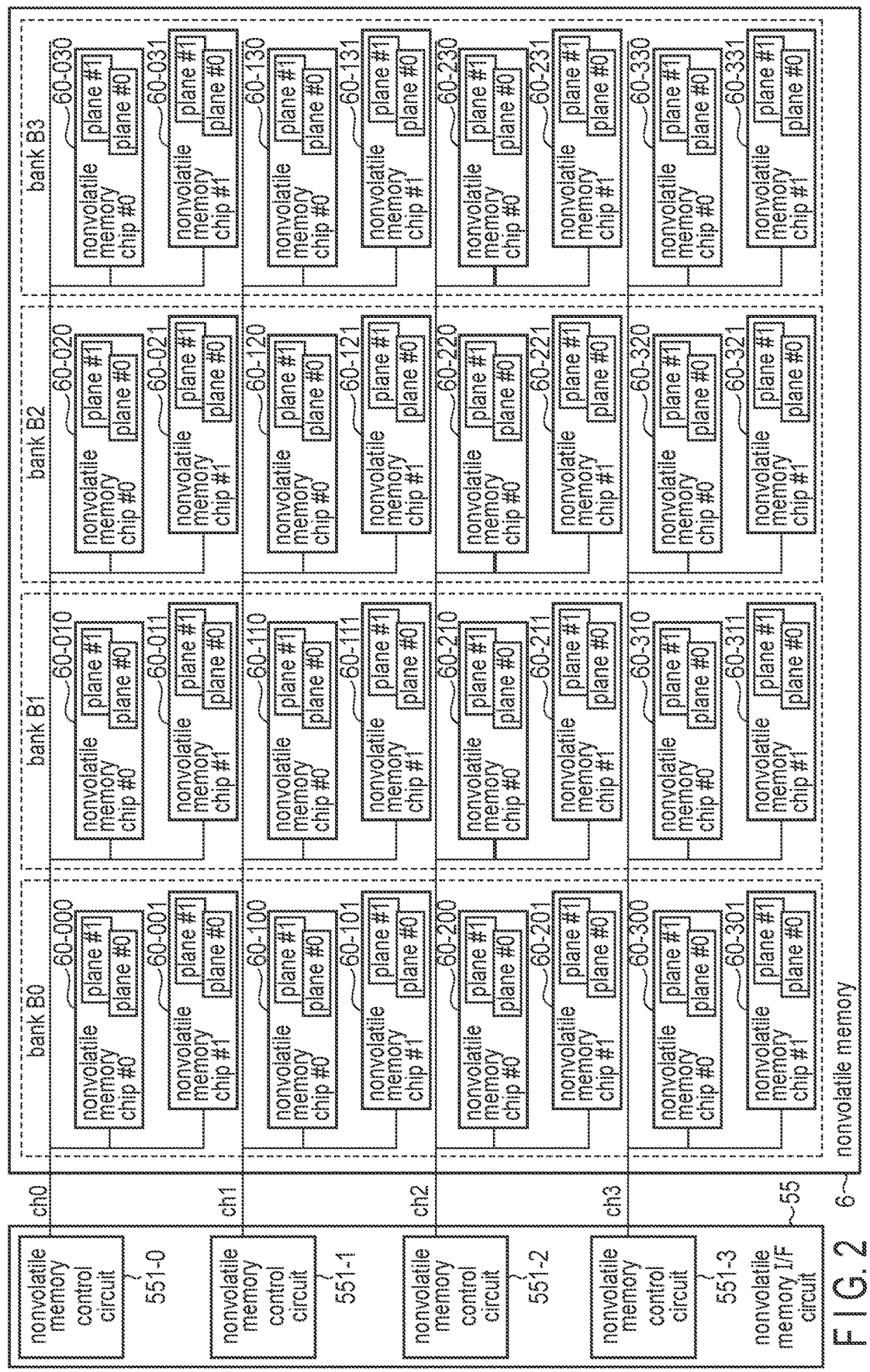
FIG. 2 is a block diagram illustrating an example of an internal configuration of a nonvolatile memory according to the embodiment of the present invention.

An example of an internal configuration of the nonvolatile memory 6 will then be described. FIG. 2 is a block diagram illustrating an example of an internal configuration of the nonvolatile memory 6 according to the embodiment of the present invention. Here, a case where the number of channels is four, the number of banks is four, and the number of planes is two will be described.

In FIG. 2, eight nonvolatile memory chips 60 are connected to each of the four channels ch0, ch1, ch2, and ch3.

Each of the four banks B0 to B3 includes eight nonvolatile memory chips 60. Two nonvolatile memory chips 60 connected to each of the four channels ch0, ch1, ch2, and ch3 are included in the same bank. A bank is a unit of a parallel operation in which nonvolatile memory chips 60 perform according to interleaved operations. Here, nonvolatile memory chips 60-000, 60-001, 60-100, 60-101, 60-200, 60-201, 60-300 and 60-301 constitute the bank B0. Nonvolatile memory chips 60-010, 60-011, 60-110, 60-111, 60-210, 60-211, 60-310, and 60-311 constitute the bank B1. Nonvolatile memory chips 60-020, 60-021, 60-120, 60-121, 60-220, 60-221, 60-320, and 60-321 the constitute bank B2. Nonvolatile memory chips 60-030, 60-031, 60-130, 60-131, 60-230, 60-231, 60-330, and 60-331 constitute the bank B3.

Each of the nonvolatile memory chips 60 includes two planes #0 and #1. Each of the nonvolatile memory chips 60 is configured to cause two blocks to operate parallel, wherein one of the two blocks is included in the plane #0 and the other is included in the plane #1.

In other words, when the number of the channels is four, the number of the banks is four, and the number of the planes is two, the nonvolatile memory 6 is configured to cause 32 blocks to operate in parallel at a maximum.

Figure 3:
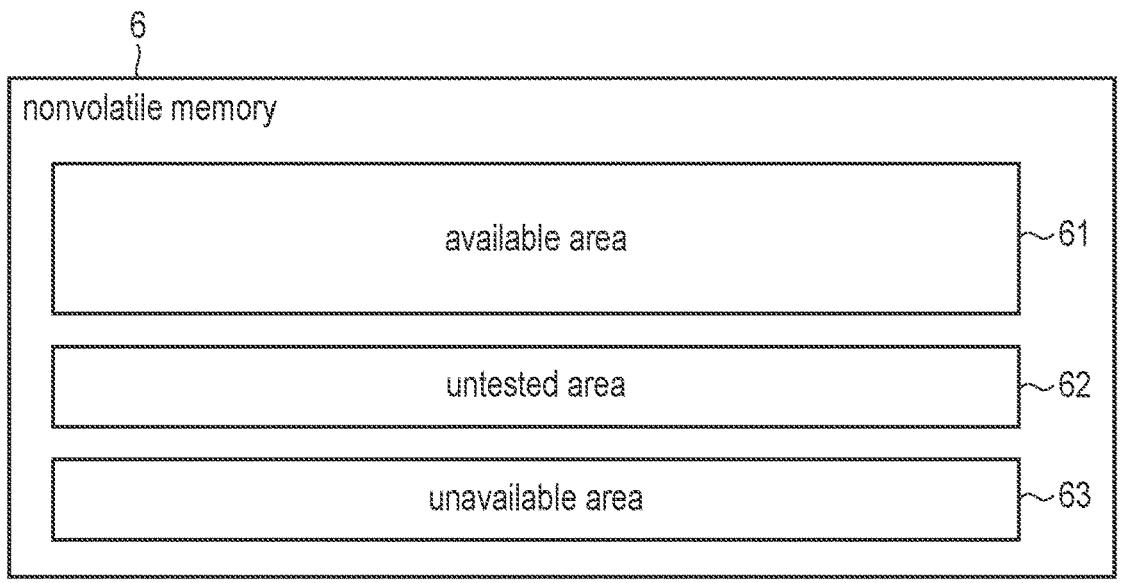
FIG. 3 is a block diagram illustrating an example of a storage area of the nonvolatile memory according to the embodiment of the present invention.

Storage areas of the nonvolatile memory 6 will then be described. FIG. 3 is a block diagram illustrating an example of storage areas of the nonvolatile memory 6 according to the embodiment of the present invention.

The nonvolatile memory 6 includes an available area 61, an untested area 62 and an unavailable area 63.

The available area 61 is a storage area which is available for data storage among tested areas. Each tested area is a storage area on which a test in a FAT process has been executed among storage areas included in the nonvolatile memory 6. The available area 61 includes, for example, multiple blocks which are available for data writing. The test in the FAT process includes, for example, a test related to a write operation of writing data and a test related to a read operation of reading data.

The untested area 62 is a storage area on which the test in the FAT process has not been executed among the storage areas included in the nonvolatile memory 6.

The unavailable area 63 is a storage area which is determined as unavailable. The unavailable area 63 includes, for example, blocks that are determined as defective blocks by the controller 5.

Figure 4:
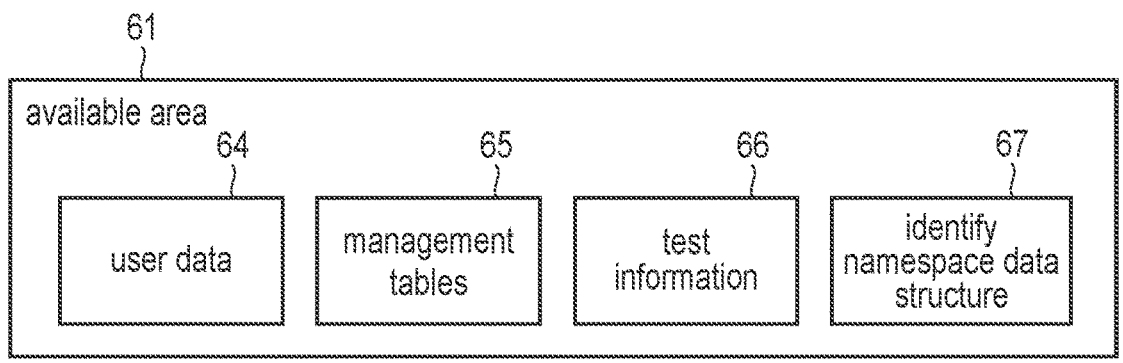
FIG. 4 is a block diagram illustrating an example of data stored in an available area of the nonvolatile memory according to the embodiment of the present invention.

Data stored in the available area 61 will then be described. FIG. 4 is a block diagram illustrating an example of data stored in the available area of the nonvolatile memory according to the embodiment of the present invention.

The data stored in the available area 61 of the nonvolatile memory 6 includes user data 64, management tables 65, test information 66, and an identify namespace data structure 67.

The user data 64 is data written in the available area 61 on the basis of a received write command.

The management tables 65 are tables in which management information is stored. The management information is information which is generated by the controller 5 to manage the memory system 3. The management tables 65 includes, for example, a logical-to-physical address translation table (L2P table) and a test execution status management table. The L2P table is a table which stores mapping information used for logical-to-physical address translation. The test execution status management table is a table which stores information indicating an execution status of the test for each plane or each block of the nonvolatile memory 6. The details of the L2P table and the test execution status management table are described later.

The test information 66 is information related to the test on each of the storage areas included in the nonvolatile memory 6. The test information 66 includes, for each of storage areas of the nonvolatile memory 6 that correspond to namespaces, respectively, information indicating whether or not the test in the FAT process has been executed. The test information 66 is information which is provided to the host 2 to notify the host 2 of tested areas and untested areas. The test information 66 may include, for each storage area corresponding to a namespace, information indicating whether or not the test related to a write operation has been executed, and information indicating whether or not the test related to a read operation has been executed. Further, the test information 66 may include, for each storage area corresponding to a namespace, information indicating the content of the test related to a write operation, and information indicating the content of the test related to a read operation. The test information 66 is individually managed for each storage area included in the nonvolatile memory 6. In other words, a plurality of items of test information 66 that correspond to the storage areas included in the nonvolatile memory 6 in a one-to-one relationship are stored in the nonvolatile memory 6.

The identify namespace data structure 67 is a data structure used to describe various types of information related to capabilities and settings of a namespace in a predetermined format. The identify namespace data structure 67 corresponds to a namespace. The identify namespace data structure 67 includes, for example, a vendor specific area. The vendor specific area is an area in which information specific to a vendor can be described. In a case where the identify namespace data structure 67 includes a vendor specific area, the same information as the test information 66 is described in the vendor specific area. Thereby, the identify namespace data structure 67 stores the same information as the test information 66.

Figure 5:
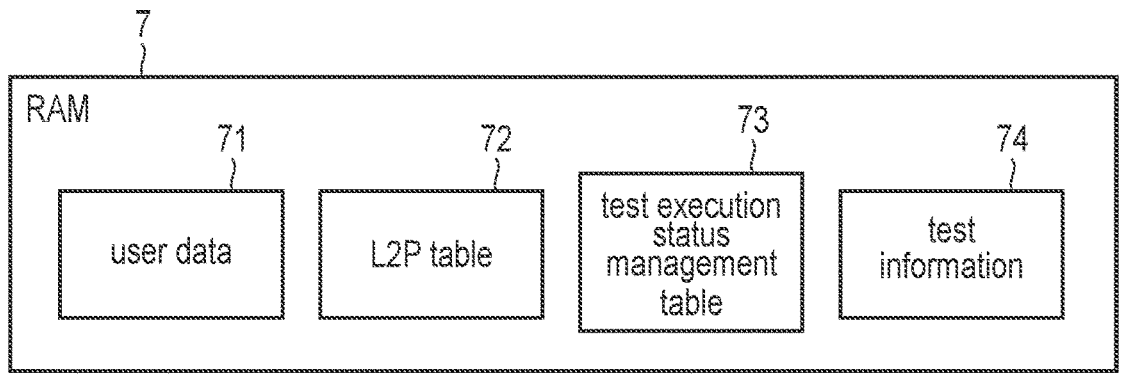
FIG. 5 is a block diagram illustrating an example of data stored in a RAM according to the embodiment of the present invention.

Data stored in the RAM 7 will then be described. FIG. 5 is a block diagram illustrating an example of data stored in the RAM 7 according to the embodiment of the present invention.

The data stored in the RAM 7 includes user data 71, an L2P table 72, a test execution status management table 73, and test information 74.

The user data 71 includes, for example, write data to be written into the nonvolatile memory 6, and read data read from the nonvolatile memory 6.

The L2P table 72 is a logical-to-physical address translation table which stores a correspondence relationship between logical addresses and the physical addresses of the nonvolatile memory 6 in a unit of predetermined size such as a sector. The L2P table 72 is loaded from the management tables 65 stored in the nonvolatile memory 6 onto the RAM 7.

The test execution status management table 73 is a table which stores, for each plane or each block of the nonvolatile memory 6, information indicating an execution status of the test. The test execution status management table 73 stores information indicating a plane or a block on which the test has been executed, and information indicating a plane or a block on which the test has not been executed. The test execution status management table 73 is loaded from the management tables 65 stored in the nonvolatile memory 6 onto the RAM 7.

The test information 74 is information related to the test. The test information 74 is the same data as part of the test information 66 stored in the nonvolatile memory 6. The test information 74 is loaded from the nonvolatile memory 6 onto the RAM 7.

Figure 6:
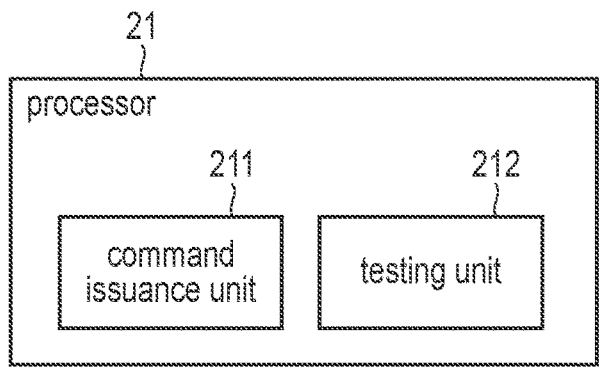
FIG. 6 is a block diagram illustrating an example of a functional configuration of a processor of a host according to the embodiment of the present invention.

A functional configuration of the processor 21 of the host 2 will then be described. FIG. 6 is a block diagram illustrating the functional configuration of the processor 21 of the host 2 according to the embodiment of the present invention.

The processor 21 includes a command issuance unit 211 and a testing unit 212. The command issuance unit 211 and the testing unit 212 may be partly or wholly realized by another hardware of the host 2.

The command issuance unit 211 issues various commands to the memory system 3. The various commands include I/O commands and management commands. The I/O commands include a write command and a read command. The management commands include, for example, an identify command. The command issuance unit 211 is configured to transmit an identify command that specifies a certain namespace, to the memory system 3.

The testing unit 212 requests the memory system 3 to execute the test on a storage area corresponding to a namespace. The testing unit 212 requests the memory system 3 to execute the test on a storage area corresponding to a namespace on the basis of the test information 66 received from the memory system 3. The testing unit 212 may know in advance a plurality of operations which should be executed as the test on each storage area. The testing unit 212 may know the operations to be executed as the test on the basis of information that is included in the received test information 66 and indicates the content of the test. The testing unit 212 determines the operations to be executed. The testing unit 212 instructs the command issuance unit 211 to issue commands that correspond to the determined operations.

Figure 7:
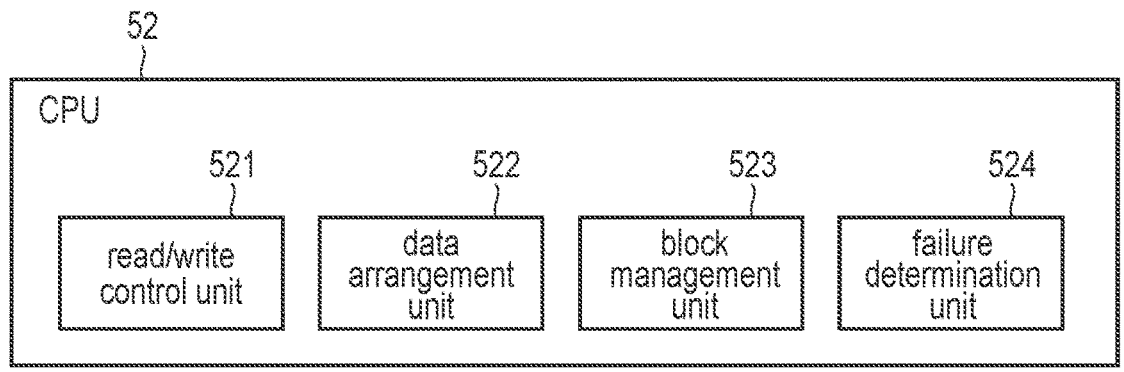
FIG. 7 is a block diagram illustrating an example of a functional configuration of a CPU according to the embodiment of the present invention.

A functional configuration of the CPU 52 of the controller 5 will then be described. FIG. 7 is a block diagram illustrating the functional configuration of the CPU 52 according to the embodiment of the present invention.

The CPU 52 includes a read/write control unit 521, a data arrangement unit 522, a block management unit 523, and a failure determination unit 524. The read/write control unit 521, the data arrangement unit 522, the block management unit 523, and the failure determination unit 524 may be partly or wholly realized by another hardware of the controller 5.

The read/write control unit 521 executes a read process and a write process. The read process is a process of instructing the nonvolatile memory 6 to execute a data read operation. The write process is a process of instructing the nonvolatile memory 6 to execute a data write operation. The write process is a process of writing data into the nonvolatile memory 6. Specifically, the read/write control unit 521 instructs the nonvolatile memory 6 to execute a data read operation on the basis of a read command. The read/write control unit 521 instructs the nonvolatile memory 6 to execute a data write operation on the basis of a write command. In addition, the read/write control unit 521 executes a completion response generation process. The completion response generation process is a process of generating a command completion response to be indicated to the host 2. In a case where a storage area designated in a read command or a write command is an untested area 62, the read/write control unit 521 executes a warning generation process. The warning generation process is a process of generating a warning that notifies the host 2 that the untested area 62 is accessed. Specifically, the read/write control unit 521 may generate a command completion response including a warning.

The data arrangement unit 522 executes garbage collection. For example, the data arrangement unit 522 executes garbage collection on the basis of the fact that the number of free blocks included in the nonvolatile memory 6 falls below a threshold. The free blocks each refer to a block not including valid data. The valid data means data stored in a physical storage location that is indicated by a physical address referred to from the L2P table 72, in other words, data associated with a logical address.

The block management unit 523 manages each of the blocks included in the nonvolatile memory 6. The block management unit 523 updates the L2P table 72 on the basis of a data write operation based on a write command, or on the basis of garbage collection executed by the data arrangement unit 522. When a block which does not include valid data arises, the block management unit 523 registers the block with the available area 61 as a free block.

The block management unit 523 manages an execution state of the test for each plane or each block included in the nonvolatile memory 6. When the test on a storage area has been completed, the block management unit 523 updates the test execution status management table 73 such that the execution status of the test for each plane or each block included in the storage area indicates that the test has been executed.

The failure determination unit 524 determines whether or not each block included in a storage area on which the test is in progress is a defective block. The defective block is a block in which data writing or reading cannot be executed correctly. When a defective block is detected in the test being executed on a storage area, the failure determination unit 524 instructs the block management unit 523 to register the detected defective block with the unavailable area 63.

Figure 8:
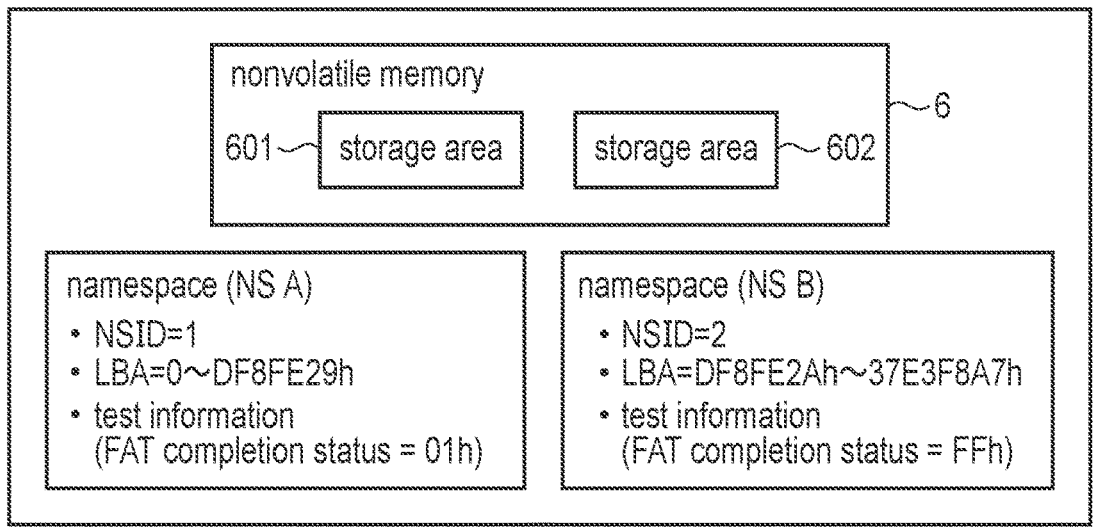
FIG. 8 illustrates an example of namespaces included in the nonvolatile memory before shipment of the memory system according to the embodiment of the present invention.

The relationship between the storage areas of the nonvolatile memory 6 and namespaces will be described. FIG. 8 illustrates an example of the relationship between the storage areas of the nonvolatile memory 6 and the namespaces before shipment of the memory system 3 according to the embodiment of the present invention. Here, a storage area 601 and a storage area 602 are included in the nonvolatile memory 6. It is assumed that the capacity of the nonvolatile memory 6 is 4 TB. The storage area 601 is a storage area on which the test related to a write operation and a read operation has been executed. It is assumed that the capacity of the storage area 601 is 1 TB. The storage area 601 is a storage area corresponding to a namespace NS A.

The storage area 602 is a storage area on which the test related to a write operation and a read operation has not been executed. It is assumed that the capacity of the storage area 602 is 3 TB. The storage area 602 is a storage area corresponding to a namespace NS B.

The namespace NS A is identified by a namespace identifier "NSID=1". In a case where the capacity per LBA is 4096 KB, the namespace NS A includes, for example, a set of contiguous LBAs from LBA=0 to LBA=DF8FE29h. The namespace NS A is a namespace for which the test has been executed. A namespace for which the test has been executed is a namespace for which the test on a corresponding storage area has been executed. In addition, a FAT completion status is associated with the namespace NS A. The FAT completion status is status information indicating whether the test related to a write operation and a read operation for a namespace has been executed. The FAT completion status is included in, for example, an identify namespace data structure corresponding to the namespace NS A as part of test information. Since the namespace NS A is a namespace for which the test has been executed, a value indicating the fact is associated with the namespace NS A as a FAT completion status. The FAT completion status corresponding to the namespace NS A is, for example, 01h.

The namespace NS B is identified by a namespace identifier "NSID=2". The namespace NS B includes, for example, a set of contiguous LBAs from LBA=DF8FE2Ah to LBA=37E3F8A7h. The namespace NS B is a namespace for which the test has not been executed. A namespace for which the test has not been executed is a namespace for which the test on a corresponding storage area has not been executed. A FAT completion status is associated with the namespace NS B. The FAT completion status is included in, for example, an identify namespace data structure corresponding to the namespace NS B as part of test information. Since the namespace NS B is a namespace for which the test has not been executed, a value indicating the fact is associated with the namespace NS B as a FAT completion status. The FAT completion status corresponding to the namespace NS B is, for example, FFh.

Here, when the namespace NS A is extended to, for example, a size corresponding to a capacity of 2 TB, a storage area having a capacity of 2 TB in total is associated with the namespace NS A. When the namespace NS B is reduced to, for example, a size corresponding to a capacity of 2 TB, a storage area having a capacity of 2 TB is associated with the namespace NS B. A portion of the storage area 602 having a capacity of 1 TB is allocated to the namespace NS A in addition to the storage area 601. A portion of the storage area 602 having a capacity of 2 TB is allocated to the namespace NS B. In this case, the test on the portion of the storage area 602 that is newly allocated to the namespace NS A has not been executed, the FAT completion status corresponding to the namespace NS A is changed to a value indicating that the test has not been executed.

The test execution status management table 73 will be described. FIG. 9A and FIG. 9B illustrate an example of the test execution status management table 73 according to the embodiment of the present invention.

In the test execution status management table 73, information indicating whether or not the test related to a write operation and a read operation has been executed is stored for each plane.

A total of four planes included in two nonvolatile memory chips 60 that belong to a combination of the channel ch0 and the bank B0 are tested areas (r1, r2, r3 and r4) on which the test related to a write operation and a read operation has been executed. A total of four planes included in two nonvolatile memory chips 60 that belong to a combination of the channel ch1 and the bank B0 are also tested areas (r17, r18, r19 and r20). A total of four planes included in two nonvolatile memory chips 60 that belong to a combination of the channel ch2 and the bank B0 are also tested areas (r33, r34, r35 and r36). Moreover, a total of four planes included in two nonvolatile memory chips 60 that belong to a combination of the channel ch3 and the bank B0 are also tested areas (r49, r50, r51 and r52).

A part of the blocks included in the tested areas is used as the storage area 601 corresponding to the namespace NS A.

Each of planes included in each of nonvolatile memory chips 60 that belong to combinations of the banks B1 to B3 and the four channels ch0 to ch3 is an untested area (r5 to t16, r21 to r32, r37 to r48 and r53 to r54). Blocks included in the untested areas is used as the storage area 602 corresponding to the namespace NS B.

The capacity of the storage area 602 corresponding to the namespace NS B is approximately three times larger than the capacity of the storage area 601 corresponding to namespace NS A. Thus, the blocks which are used as the storage area 602 are approximately three times as many as the blocks which are used as the storage area 601.

The test execution status management table 73 may store information indicating an execution status of the test for a unit smaller than a plane, such as a unit of a block.

Hereinafter, the identify namespace data structure 67 transmitted by the memory system 3 to the host 2 in response to receiving an identify command from the host 2 will be described. FIG. 10 illustrates an example of the identify namespace data structure 67 which stores test information according to the embodiment of the present invention.

When a namespace identifier is included in an identify command received from the host 2, the memory system 3 transmits the identify namespace data structure 67 to the host 2.

The identify namespace data structure 67 stores information related to a namespace designated in the identify command. The identify namespace data structure 67 stores various types of information related to the namespace, such as the size (the number of LBAs) and the capacity of the namespace. For example, in the initial area of 8 bytes (07:00) of the identify namespace data structure 67, information indicating the size of the namespace is stored. The areas of the 384th byte to the 4095th byte of the identify namespace data structure 67 are vendor specific areas. The vendor specific areas are areas which are available for storage of information specific to a vendor of a storage device.

For example, the area of the 4000th byte of the identify namespace data structure 67 is used to store a FAT completion status as test information that corresponds to the namespace designated in the identify command. The FAT completion status indicates that the test related to a write operation and a read operation for the namespace designated in the identify command has not been executed (FFh), or is in progress (00h), or has been executed (completed: 01h).

Test information including a plurality of completion statuses will then be described. FIG. 11 illustrates another example of the identify namespace data structure 67 which stores the same information as test information according to the embodiment of the present invention.

The identity namespace data structure 67 corresponding to a namespace that is designated in an identify command received from the host 2 stores test information. The test information includes a FAT completion status corresponding to the designated namespace, and information indicating whether or not each of multiple operations on the designated namespace has been executed.

The FAT completion status corresponding to the designated namespace is stored in the area of the 4000th byte of the identify namespace data structure 67 corresponding to the designated namespace.

Information indicating whether or not a format operation on the designated namespace has been executed is stored in the area of the 4001st byte of the identify namespace data structure 67.

Information indicating whether or not the test related to a write operation for the designated namespace has been executed is stored in the area of the 4002nd byte of the identify namespace data structure 67. The information in the area of the 4002nd byte indicates, for example, whether or not the test related to a sequential write on the namespace has been executed. The sequential write is an operation for sequentially writing data from a start logical address (start LBA) to an end logical address (end LBA) of the namespace.

Information indicating whether or not the test related to a read operation on the designated namespace has been executed is stored in the area of the 4003rd byte of the identify namespace data structure 67. The information in the area of the 4003rd byte indicates, for example, whether or not the test related to a sequential read on the namespace has been executed. The sequential read is an operation for sequentially reading data from the start logical address (start LBA) to the end logical address (end LBA) of the namespace.

In any information, FFh indicates "not executed", and 00h indicates "in progress", and 01h indicates "completed".

When none of a format operation, the test related to a write operation and the test related to a read operation has been executed, information in the area of the 4000th byte indicates 00h. Information in the area of the 4001st byte, information in the area of the 4002nd byte and information in the area of the 4003rd byte indicate FFh.

When a format operation has been executed, and both the test related to a write operation and the test related to a read operation have not been executed, the information in the area of the 4000th byte indicates 00h. The information in the area of the 4001st byte indicates 01h. The information in the area of the 4002nd byte and the information in the area of the 4003rd byte indicate FFh.

When a format operation and the test related to a write operation has been executed, and the test related to a read operation has not been executed, the information in the area of the 4000th byte indicates 00h. The information in the area of the 4001st byte and the information in the area of the 4002nd byte indicate 01h. The information in the area of the 4003rd byte indicates FFh.

When a format operation, the test related to a write operation and the test related to a read operation have been executed, the information in the area of the 4000th byte, the information in the area of the 4001st byte, the information in the area of the 4002nd byte, and the information in the area of the 4003rd byte indicate 01h.

Hereinafter, a case where test information includes information indicating the specific content of the test to be executed will be described. FIG. 12 illustrates an example of the identify namespace data structure 67 which stores the same information as test information indicating a write operation or a read operation, according to the embodiment of the present invention.

The identify namespace data structure 67 that corresponds to a namespace designated in an identify command received from the host 2 stores test information. The test information includes information indicating the content of a test related to a write operation, and information indicating the content of a test related to a read operation.

Here, in areas having a size of 40 bytes from the 400th byte to the 439th byte, information indicating the content of a test related to a write operation or a read operation is stored. The information indicating the content of the test includes an action code, a size, an opcode, sequential/random, a FAT completion status, a start LBA, an end LBA, the number of logical blocks (NBL), execution time (EX-TIM), and an interval.

The action code is information indicating a command set issued by the host 2. The action code is stored in an area having a size of 2 bytes that includes an area of the 400th byte and an area of the 401st byte of the identify namespace data structure 67. The action code indicating 0001h represents Admin Command Set which is management commands defined in the NVMe standard. The action code indicating 0002h represents NVM Command Set which is I/O commands defined in the NVMe standard. The action code indicating 8000h represents Wait which is a wait operation. It should be noted that a vendor specific command which is a command specific to a vendor may be used as an I/O command.

Here, the action code is set to 0002h. In this case, NVM Command Set is selected as a command set issued by the host 2.

The size is information indicating the number of bytes of the information that indicates the content of the test (here, 40 bytes). The size is stored in an area of the 402nd byte of the identify namespace data structure 67.

The opcode is information indicating the type of a command issued by the host 2. The opcode is stored in an area of the 404th byte of the identify namespace data structure 67. In the case of NVM command Set, the opcode indicating 00h represents a flush command. The opcode indicating 01h represents a write command. The opcode indicating 02h represents a read command.

The sequential/random is information indicating sequential access or random access. The sequential/random is stored in an area of the 405th byte of the identify namespace data structure 67. In the sequential/random, 00h indicates sequential access, and 01h indicates random access.

The FAT completion status is information indicating whether or not the test that is indicated by the information described in the areas from the 400th byte to the 439th byte has been executed. The FAT completion status is stored in an area having a size of 2 bytes that includes an area of the 406th byte and an area of the 407th byte of the identify namespace data structure 67. The FAT completion status indicating FFh indicates that the test has not been executed.

The FAT completion status indicating 00h indicates that the test is in progress. The FAT completion status indicating 01h indicates that the test is completed.

The start LBA and the end LBA are information which specifies a range of LBAs accessed in the test. The start LBA is stored in an area that has a size of 8 bytes from the 408th byte to the 415th byte of the identify namespace data structure 67. The end LBA is stored in an area that has a size of 8 bytes from the 416th byte to the 423rd byte of the identify namespace data structure 67.

The number of logical blocks (NLB) is information indicating the number of LBAs written or read on the basis of a command issued by the host 2. The NLB is stored in an area that has a size of 4 bytes from the 424th byte to the 427th byte of the identify namespace data structure 67.

The execution time (EXTIM) is information indicating a time for which access to the range of the LBAs designated by the start LBA and the end LBA is continuously executed. The EXTIM is stored in an area that has a size of 4 bytes from the 428th byte to the 431st byte of the identify namespace data structure 67. When the EXTIM is 0, the execution time is not specified. In the case of random access, a valid value other than 0 needs to be set in the EXTIM. In the case of sequential access, the EXTIM may be ignored.

The interval is information indicating a time interval between two successive commands issued by the host 2. The interval is stored in an area that has a size of 4 bytes from the 432nd byte to the 435th byte of the identify namespace data structure 67. When the interval is 0, the host 2 is configured to issue a command at freely selected time intervals.

On the basis of the 40 bytes of information stored as test information in the identify namespace data structure 67, the host 2 is configured to transmit a plurality of write commands or a plurality of read commands to the memory system 3.

In a case where the action code indicates 0002h, the opcode indicates 01h, and the sequential/random indicates 00h, the host 2 transmits a plurality of write commands to the memory system 3 such that data is sequentially written from the start LBA to the end LBA. The write commands are generated on the basis of the information described in the areas from the 400th byte to the 439th byte. Each of the write commands includes, for example, a namespace identifier, a start LBA, a data size, and a data pointer. The namespace identifier identifies a namespace into which write data is written. The start LBA indicates the first LBA into which the write data is written. The data size indicates the size of the write data, in other words, the number of LBAs into which the write data is written according to the write command. The data pointer indicates a buffer address in the memory 22 of the host 2 in which the write data is stored.

In a case where the action code indicates 0002h, and the opcode indicates 02h, and the sequential/random indicates 00h, the host 2 transmits a plurality of read commands to the memory system 3 such that data is sequentially read from the start LBA to the end LBA. Each of the read commands includes, for example, a namespace identifier, a start LBA, a data size, and a data pointer. The namespace identifier identifies a namespace from which read data is read. The start LBA indicates the first LBA from which the read data is read. The data size indicates the size of the read data, in other words, the number of LBAs from which the read data is read. The data pointer indicates a buffer address in the memory 22 to which the read data is transferred.

Hereinafter, a case where test information includes information indicating the content of a wait operation will be described. FIG. 13 illustrates an example of the identify namespace data structure 67 which stores the same information as test information indicating a wait operation, according to the embodiment of the present invention.

The identify namespace data structure 67 corresponding to a namespace designated in an identify command received from the host 2 stores the same information as test information. The test information may include information indicating a wait operation in addition to information indicating a write operation and information indicating a read operation.

Here, in an area having a size of 16 bytes from the 400th byte to the 415th byte, information representing a wait operation is stored.

An action code indicating 8000h is information representing "Wait" which is the wait operation.

A size (here, 16 bytes) is information indicating the number of bytes of the information representing the wait operation.

A FAT completion status is information indicating whether or not the test (wait operation) indicated by the information described in the area from the 400th byte to the 415th byte has been executed. The FAT completion status indicating FFh indicates that the wait operation has not been executed. The FAT completion status indicating 00h indicates that the wait operation is in progress. The FAT completion status indicating 01h indicates that the wait operation is completed.

Waiting time (WTS) is information which specifies the waiting time in seconds. The WTS is stored in an area having a size of 4 bytes from the 408th byte to the 411th byte of the identify namespace data structure 67.

Waiting time (WTMS) is information which specifies the waiting time in milliseconds. The WTMS is stored in an area having a size of 4 bytes from the 412th byte to the 415th byte of the identify namespace data structure 67.

Hereinafter, the identify namespace data structure 67 which stores test information indicating the content of a test related to a write operation, the content of a wait operation and the content of a test related to a read operation will be described. FIG. 14 illustrates an example of the identify namespace data structure 67 which stores the same information as test information indicating a write operation, a wait operation and a read operation according to the embodiment of the present invention.

Here, it is assumed a case where an identify command which specifies the namespace identifier NSID2 of the namespace NS B is received from the host 2.

The identify namespace data structure 67 corresponding to the namespace NS B stores the same information as test information. The test information includes information indicating the content of a test related to a write operation (write test), information indicating a wait operation, and information indicating the content of a test related to a read operation (read test).

The information indicating the content of the test related to a write operation is stored in areas (first entry) which start from an address 190h and have a size of 40 bytes in the identify namespace data structure 67. The area specified by the address 190h and an offset 0 corresponds to the area of the 400th byte from the first area of the identify namespace data structure 67. Here, each value is shown in a little endian format. For this reason, regarding a bit string having a size of two or more bytes, lower bits of the bit string are stored in an area corresponding to an address lower than an area in which higher bits of the bit string are stored.

In areas of 2 bytes specified by the address 190h and two offsets 0 and 1, the action code "0002h" indicating NVM Command Set is stored. In other words, 0200h stored in the areas of 2 bytes corresponds to the action code "0002h".

In an area of 1 byte specified by the address 190h and an offset 2, a value (28h) indicating that the size of information indicating the content of the test related to a write operation is 40 bytes is stored.

In an area of 1 byte specified by the address 190h and an offset 4, an opcode (01h) indicating a write operation is stored.

In an area of 1 byte specified by the address 190h and an offset 5, a value (00h) indicating sequential access is stored.

In areas of 2 bytes specified by the address 190h and two offsets 6 and 7, a FAT completion status (00FFh) indicating that the test related to a write operation has not been executed is stored.

In areas of 8 bytes specified by an address 198h and eight offsets 0 to 7, a start LBA (000000000DF8FE2Ah) of a range of LBAs that is a target of the test related to a write operation is stored.

In areas of 8 bytes specified by an address 1A0h and eight offsets 0 to 7, an end LBA (0000000037E3F8A7h) of the range of LBAs that is the target of the test related to a write operation is stored.

In areas of 4 bytes specified by the address 1A8h and four offsets 0 to 3, an NLB (00000100h) indicating the number of the LBAs to which data is written by a write command is stored.

Here, neither execution time (1ACh to 1AFh) nor an interval (1B0h to 1B7h) is specified.

The information indicating a wait operation is stored in areas (second entry) having a size of 16 bytes starting from an address 1B8h.

In areas of 2 bytes specified by the address 1B8h and two offsets 0 and 1, an action code "8000h" indicating a wait operation is stored.

In an area of 1 byte specified by the address 1B8h and offset 2, a value (10h) indicating that the size of information indicating a wait operation is 16 bytes is stored.

In areas of 2 bytes specified by the address 1B8h and two offsets 6 and 7, a FAT completion status (00FFh) indicating that a wait operation has not been executed is stored.

In areas of 4 bytes specified by an address 1C0h and four offsets 0 to 3, WTS (00000708h) indicating that the waiting time is 1800 seconds is stored. The waiting time indicates a waiting time inserted between the test related to a write operation that is stored in the first entry and the test related to a read operation that is stored in the third entry.

Here, WTMS is not specified.

The information indicating the content of the test related to a read operation is stored in areas (third entry) having a size of 40 bytes starting from an address 1C8h.

In the areas of 2 bytes specified by an address 1C8h and two offsets 0 and 1, the action code "0002h" indicating NVM Command Set is stored.

In the area of 1 byte specified by the address 1C8h and offset 2, a value (28h) indicating that the size of information indicating the content of the test related to a read operation is 40 bytes is stored.

In the area of 1 byte specified by the address 1C8h and offset 4, an opcode (02h) indicating a read operation is stored.

In the area of 1 byte specified by the address 1C8h and offset 5, a value (00h) indicating sequential access is stored.

In the areas of 2 bytes specified by the address 1C8h and two offsets 6 and 7, a FAT completion status (00FFh) indicating that the test related to a read operation has not been executed is stored.

In the areas of 8 bytes specified by an address 1D0h and eight offsets 0 to 7, a starting LBA (000000000DF8FE2Ah) in the range of the target LBAs of the test related to a read operation is stored.

In the areas of 8 bytes specified by an address 1D8h and eight offsets 0 to 7, an end LBA (0000000037E3F8A7h) in the range of the target LBAs of the test related to a read operation is stored.

In the areas of 4 bytes specified by an address 1E0h and four offsets 0 to 3, an NLB (00000100h) indicating the number of LBAs from which data is read by a single read command is stored.

Here, neither execution time (1E4h to 1E7h) nor an interval (1E8h to 1E3h) is specified.

Figure 16:
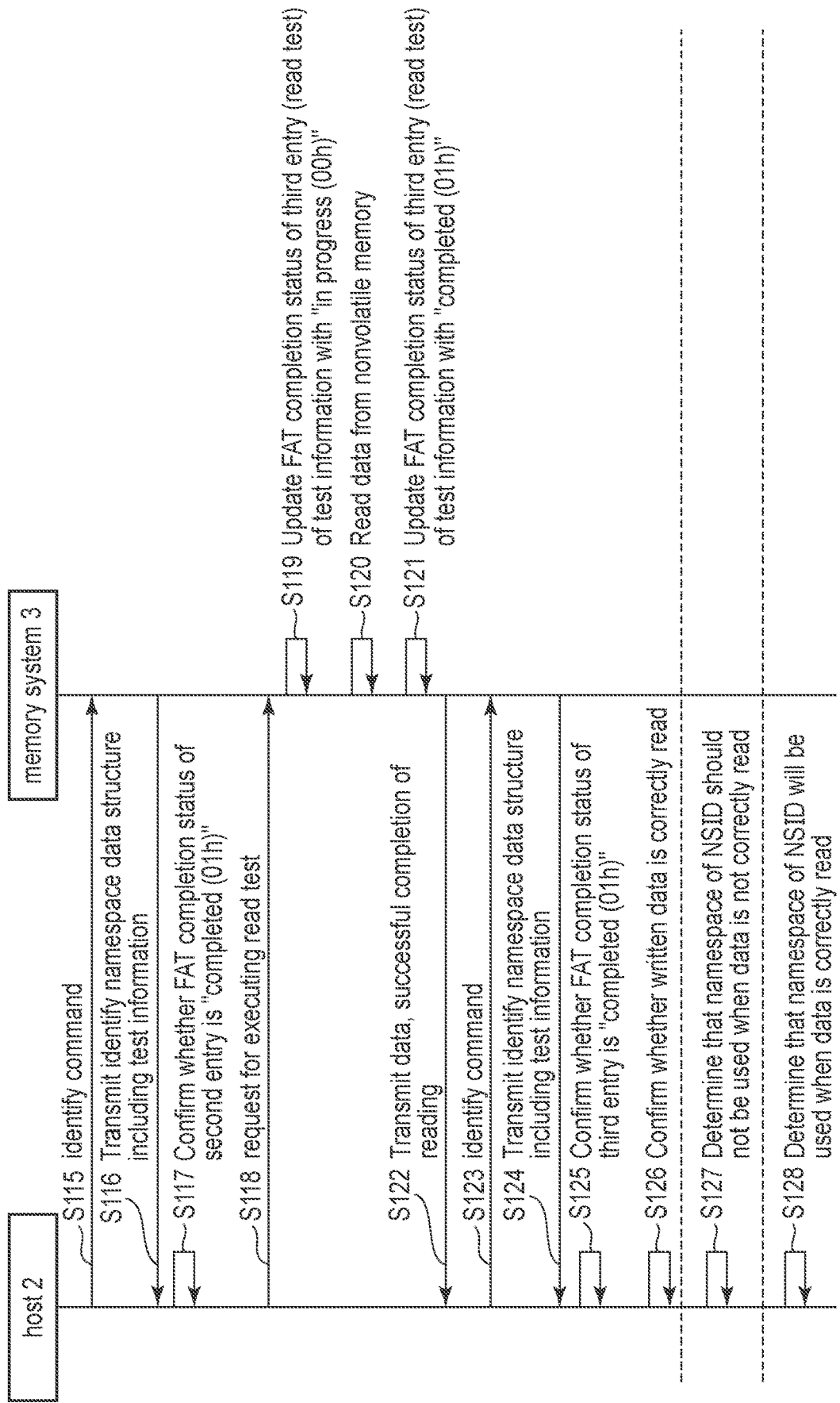
FIG. 16 is a sequence diagram illustrating a part subsequent to the example of the procedure of the test process executed in the host and the memory system according to the embodiment of the present invention.

Next, the test executed in the memory system 3 and the host 2 will be described. FIG. 15 and FIG. 16 are sequence diagrams illustrating the procedure of the test executed in the memory system 3 and the host 2 according to the embodiment of the present invention.

For example, when the memory system 3 is connected to the host 2, the host 2 transmits an identify command to the memory system 3 (S101). The identify command includes a namespace identifier specifying a certain namespace included in the nonvolatile memory 6 of the memory system 3.

In response to receiving the identify command, the controller 5 of the memory system 3 transmits the identify namespace data structure 67 which stores test information to the host 2 (S102). Specifically, the controller 5 identifies a namespace specified by the namespace identifier included in the received identify command. The controller 5 transmits the identify namespace data structure 67 corresponding to the identified namespace to the host 2. The identify namespace data structure 67 stores the same information as test information related to the identified name space.

The host 2 confirms the content of the received test information (S103). The received test information includes: a first entry including information that indicates the content of a test related to a write operation; a second entry including information that indicates a wait operation; and a third entry including information that indicates the content of a test related to a read operation. The operation indicated by the information included in each of the entries has not been executed.

On the basis of the information included in the first entry of the test information, the host 2 transmits, to the memory system 3, a request to execute a write test on a specified namespace, and data to be written (S104). Specifically, on the basis of the information included in the first entry of the test information, the host 2 generates write commands each including a namespace identifier of the specified namespace. The host 2 transmits the generated write commands to the memory system 3 as the request to execute the write test. The data to be written is any data generated by the host 2.

When the host 2 requests the memory system 3 to execute the test related to a write operation on the namespace, the controller 5 of the memory system 3 updates a FAT completion status included in the first entry with a value (00h) indicating that the test is in progress (S105).

The controller 5 of the memory system 3 writes data into the nonvolatile memory 6 (S106). Specifically, on the basis of each of the write commands received from the host 2, the controller 5 executes, as the test related to a write operation, an operation of writing the data into storage areas in the nonvolatile memory 6 that are allocated for the specified namespace. When a defective block into which data cannot be correctly written is detected while the test related to a write operation is executed, the controller 5 may execute a process of replacing the detected defective block by another block.

When writing of the data into all the storage areas, which are allocated for the specified namespace, has been successfully completed, the controller 5 of the memory system 3 updates the FAT completion status included in the first entry with a value (01h) indicating "completed" (S107).

The controller 5 of the memory system 3 transmits, to the host 2, notice indicating that the test related to a write operation for the specified namespace has been successfully completed (successful completion of writing) (S108).

When the successful completion of writing is received from the memory system 3, the host 2 transmits, to the memory system 3, an identify command specifying the same namespace as the namespace specified by the identify command that was transmitted to the memory system 3 in S101 (S109).

In response to receiving the identify command, the controller 5 of the memory system 3 transmits the identify namespace data structure 67 which stores test information to the host 2 (S110).

In response to receiving the identify namespace data structure 67, the host 2 confirms whether or not the FAT completion status included in the first entry of the test information is a value (01h) indicating "completed" (S111). When the FAT completion status included in the first entry is not a value indicating "completed", the host 2 stops the test for the namespace.

After transmitting the identify namespace data structure 67 which stores the same information as test information to the host 2, the controller 5 of the memory system 3 updates the FAT completion status included in the second entry of the test information with a value (00h) indicating "in progress" (S112). The second entry stores information indicating the wait operation. The wait operation is an operation of waiting for a certain time after data is written into the nonvolatile memory 6. Accordingly, after transmitting the identify namespace data structure 67 in S110, the controller 5 of the memory system 3 recognizes that a wait is in progress by the host 2.

The host 2 executes a wait (S113). Specifically, the host 2 waits for a certain time (here, 1800 seconds=30 minutes) on the basis of the waiting time (WTS or WTMS) included in the second entry of the test information.

After the elapse of the certain time from the transmission of the identify namespace data structure 67 in S110, the controller 5 of the memory system 3 updates the FAT completion status included in the second entry with a value (01h) indicating "completed" (S114).

After the elapse of the certain time from the start of the wait, the host 2 transmits, to the memory system 3, an identify command which specifies the same namespace as the namespace specified by the identify command that was transmitted to the memory system 3 in S101 (S115).

In response to receiving the identify command, the controller 5 of the memory system 3 transmits the identify namespace data structure 67 which stores test information to the host 2 (S116).

In response to receiving the identify namespace data structure 67, the host 2 confirms whether or not the FAT completion status included in the second entry of the test information is the value (01h) indicating "completed" (S117). When the FAT completion status included in the second entry is not the value indicating "completed", the host 2 suspends the test for the namespace.

On the basis of the information included in the third entry of the test information, the host 2 transmits, to the memory system 3, a request to execute a read test on a specified namespace (S118). Specifically, on the basis of the information included in the third entry of the test information, the host 2 generates read commands each including a namespace identifier of the specified namespace. The host 2 transmits the generated read commands to the memory system 3 as the request to execute the read test.

When the host 2 requests the memory system 3 to execute the test related to a read operation on the specified namespace, the controller 5 of the memory system 3 updates the FAT completion status included in the third entry with a value (00h) indicating "in progress" (S119).

The controller 5 of the memory system 3 reads data from the nonvolatile memory 6 (S120). Specifically, on the basis of each of the read commands received from the host 2, the controller 5 reads data from storage areas in the nonvolatile memory 6 that are allocated for the specified namespace.

In response to a successful completion of reading data from all the storage areas, which are allocated for the specified namespace, the controller 5 of the memory system 3 updates the FAT completion status included in the third entry to a value (01h) indicating "completed" (S121).

The controller 5 of the memory system 3 transmits, to the host 2, the data read from the specified namespace, and notice indicating that the test related to a read operation has been successfully completed (successful completion of reading) (S122).

When the host 2 receives the data and the successful completion of reading from the memory system 3, the host 2 transmits, to the memory system 3, an identify command specifying the same namespace as the namespace specified by the identify command that was transmitted to the memory system 3 in S101 (S123).

In response to receiving the identify command, the controller 5 of the memory system 3 transmits the identify namespace data structure 67 which stores the same information as test information to the host 2 (S124).

In response to receiving the identify namespace data structure 67, the host 2 confirms whether or not the FAT completion status included in the third entry of the test information is the value (01h) indicating that the test is completed (S125). When the FAT completion status included in the third entry is not the value indicating "completed", the host 2 stops the test for the namespace.

When the FAT completion status included in the third entry is the value indicating a completion, the host 2 confirms whether or not the data written in the nonvolatile memory 6 on the basis of the write commands is correctly read from the nonvolatile memory 6 on the basis of the read commands (S126). In other words, the host 2 confirms whether or not the data transmitted to the memory system 3 matches the data received from the memory system 3.

When the data written in the nonvolatile memory 6 is not correctly read from the nonvolatile memory 6 (S126 No), the host 2 determines that the specified namespace should not be used as a storage area into which user data is writable (S127).

When the data written in the nonvolatile memory 6 is correctly read from the nonvolatile memory 6 (S126 Yes), the host 2 determines that the specified namespace is used as a storage area into which user data is writable (S128).

By the above procedure, the testing process for the namespace NS B is completed.

Here, the procedure of the testing process in a case where test information includes the content of a test related to a write operation, the content of a wait operation and the content of a test related to a read operation is described. It should be noted that the test information transmitted from the memory system 3 to the host 2 may be merely information indicating whether or not the test for a namespace has been executed. When the test related to a write operation and a read operation for the namespace has not been executed, the host 2 transmits a request to execute the test to the memory system 3 on the basis of the known content of the test.

In this way, even when the test information is merely information indicating whether or not the test for a namespace has been executed, the host 2 and the controller 5 can perform a process similar to the process explained in FIG. 15 and FIG. 16.

Also, a case where the nonvolatile memory 6 includes a plurality of storage areas each corresponding to one of a plurality of namespaces is described. However, each storage area of the nonvolatile memory 6 may be a storage area other than the storage areas corresponding to the namespaces.

As explained above, according to the embodiment of the present invention, the controller 5 can notify the host 2 whether each storage area is an untested area or a tested area. When execution of a test on an untested area is requested by the host 2, the controller 5 can execute the test on the untested area. Accordingly, the controller 5 can execute the test on the untested area in accordance with the request from the host 2 after the shipment of the memory system 3. This enables the memory system 3 including an untested area to be shipped out. In other words, the time for executing the test in the FAT process can be reduced.

Since the time required for the FAT process for each memory system 3 is shortened, the number of memory systems 3 to be shipped can be increased, and the production costs of the memory systems 3 can be reduced.

The nonvolatile memory 6 of the memory system 3 includes an untested area and a tested area. Thus, for example, the host 2 may use only the tested area. When use of the untested area is needed, the host 2 may request the memory system 3 to execute the test on the untested area. In this way, the test on the untested area can be executed at a certain time determined by the host 2. As a result, it is possible to reduce the processing load on the host 2 related to the test on the untested area.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A memory system comprising:
a nonvolatile memory that includes storage areas; and
a controller configured to control the nonvolatile memory, wherein
the storage areas include at least a first storage area for which a test related to a write operation and a read operation has been executed before shipment of the memory system, and a second storage area for which the test has not been executed before the shipment of the memory system, and
the controller is configured to:
manage first test information and second test information, the first test information including status information indicating that the test for the first storage area has been executed before the shipment of the memory system, the second test information including status information indicating that the test for the second storage area has not been executed before the shipment of the memory system;
in response to receiving, from a host, a command to acquire information related to the second storage area, transmit the second test information that corresponds to the second storage area to the host;
when execution of the test for the second storage area is requested by the host, execute the test for the second storage area; and
when the test for the second storage area has been completed, update the status information of the second test information with a first value indicating that the test for the second storage area has been executed.

2. The memory system of claim 1, wherein
the second test information further includes first information and second information, the first information indicating content of a write test that is related to the write operation to be executed on the second storage area, the second information indicating content of a read test that is related to the read operation to be executed on the second storage area, and
the controller is configured to:
receive, from the host, write commands that are issued by the host and are based on the first information included in the second test information;
execute, as the write test for the second storage area, operations of writing first write data from the host into the second storage area in accordance with the received write commands;
receive, from the host, read commands that are issued by the host and are based on the second information included in the second test information; and
execute, as the read test for the second storage area, operations of reading data from the second storage area and operations of transmitting the read data to the host in accordance with the received read commands.

3. The memory system of claim 2, wherein
the first information includes information indicating a start logical address and an end logical address of a range of logical addresses on which the write operation is to be executed, and information indicating a number of logical addresses to which data is written in accordance with a write command, and
the second information includes information indicating a start logical address and an end logical address of a range of logical addresses on which the read operation is to be executed, and information indicating a number of logical addresses from which data is read in accordance with a read command.

4. The memory system of claim 2, wherein
the second test information further includes third information that indicates a wait time that is inserted between the write test and the read test, and
the read commands are issued by the host after elapse of the wait time from completion of writing data into the second storage area.

5. The memory system of claim 2, wherein
the first information includes status information that indicates whether the write test has been executed,
the second information includes status information that indicates whether the read test has been executed, and
the controller is configured to:
when the write test for the second storage area has been completed, update the status information included in the first information with a first value indicating that the write test for the second storage area has been executed; and
when the read test for the second storage area has been completed, update the status information included in the second information with a first value indicating that the read test for the second storage area has been executed.

6. The memory system of claim 1, wherein
the first storage area is a storage area corresponding to a first namespace that is used by the host to access the memory system, and
the second storage area is a storage area corresponding to a second namespace that is used by the host to access the memory system.

7. The memory system of claim 1, wherein the nonvolatile memory includes a NAND flash memory.

8. The memory system of claim 1, wherein the controller is further configured to connect to the host through a PCI Express™ bus.

9. The memory system of claim 1, wherein the first and second test information are stored in the nonvolatile memory.

10. The memory system of claim 1, further comprising another memory, wherein the controller is further configured to manage the first and second test information using the another memory.

11. An information processing system comprising:
a memory system comprising a nonvolatile memory that includes storage areas, and a controller configured to control the nonvolatile memory; and
a host, wherein
the storage areas include at least a first storage area for which a test related to a write operation and a read operation has been executed before shipment of the memory system, and a second storage area for which the test has not been executed before the shipment of the memory system,
the controller manages first test information and second test information, the first test information including status information indicating that the test for the first storage area has been executed before the shipment of the memory system, the second test information including status information indicating that the test for the second storage area has not been executed before the shipment of the memory system,
the host is configured to:
acquire the first test information and the second test information from the memory system; and
when the status information of the second test information indicates that the test for the second storage area has not been executed, request the memory system to execute the test for the second storage area, and
the controller is configured to:
in response to receiving, from the host, a command to acquire information related to the second storage area, transmit the second test information that corresponds to the second storage area to the host;
when execution of the test for the second storage area is requested by the host, execute the test for the second storage area; and
when the test for the second storage area has been completed, update the status information of the second test information with a first value indicating that the test for the second storage area has been executed.

12. The information processing system of claim 11, wherein
the second test information further includes first information and second information, the first information indicating content of a write test related to the write operation to be executed on the second storage area, and the second information indicating content of a read test related to the read operation to be executed on the second storage area,
the host is configured to:
transmit, to the memory system, write commands that are based on the first information included in the second test information; and
transmit, to the memory system, read commands that are based on the second information included in the second test information,
the controller is configured to:
execute, as the write test for the second storage area, operations of writing first write data from the host into the second storage area in accordance with the write commands; and
execute, as the read test for the second storage area, operations of reading data from the second storage area and operations of transmitting the read data to the host in accordance with the read commands, and
the host is configured to determine whether the second storage area is used to write data depending on whether the data transmitted from the memory system matches the first write data.

13. The information processing system of claim 12, wherein
the first information includes information indicating a start logical address and an end logical address of a range of logical addresses on which the write operation is to be executed, and information indicating a number of logical addresses to which data is written in accordance with a write command, and
the second information includes information indicating a start logical address and an end logical address of a range of logical addresses on which the read operation is to be executed, and information indicating a number of logical addresses from which data is read in accordance with a read command.

14. The information processing system of claim 12, wherein
the second test information further includes third information that indicates a wait time that is inserted between the write test and the read test, and
the host is configured to transmit the read commands to the memory system after elapse of the wait time from completion of execution of the write commands.

15. The information processing system of claim 12, wherein
the first information includes status information that indicates whether the write test for the second storage area has been executed,
the second information includes status information that indicates whether the read test for the second storage area has been executed, and the controller is configured to:
when the write test for the second storage area has been completed, update the status information included in the first information with a first value indicating that the write test for the second storage area has been executed; and
when the read test for the second storage area has been completed, update the status information included in the second information with a first value indicating that the read test for the second storage area has been executed.

16. The information processing system of claim 11, wherein
the first storage area is a storage area corresponding to a first namespace that is used by the host to access the memory system, and
the second storage area is a storage area corresponding to a second namespace that is used by the host to access the memory system.

17. The information processing system of claim 11, wherein the nonvolatile memory includes a NAND flash memory.

18. The information processing system of claim 11, wherein the controller is further configured to connect to the host through a PCI Express™ bus.

19. The information processing system of claim 11, wherein the first and second test information are stored in the nonvolatile memory.

20. The information processing system of claim 11, further comprising another memory, wherein the controller is further configured to manage the first and second test information using the another memory.

* * * * *